US012686110B2

(12) United States Patent
Onoda et al.

(10) Patent No.: US 12,686,110 B2
(45) Date of Patent: Jul. 21, 2026

(54) SUBSTRATE TRANSFER DEVICE

(71) Applicant: NISSIN ION EQUIPMENT CO., LTD., Koka-city (JP)

(72) Inventors: Masatoshi Onoda, Koka-city (JP); Daiki Takashima, Koka-city (JP)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 245 days.

(21) Appl. No.: 18/689,560

(22) PCT Filed: Aug. 3, 2022

(86) PCT No.: PCT/JP2022/029754
§ 371 (c)(1),
(2) Date: Mar. 6, 2024

(87) PCT Pub. No.: WO2023/032571
PCT Pub. Date: Mar. 9, 2023

(65) Prior Publication Data
US 2024/0383127 A1 Nov. 21, 2024

(30) Foreign Application Priority Data
Sep. 6, 2021 (JP) ................................. 2021-144853

(51) Int. Cl.
*B25J 5/02* (2006.01)
*B25J 9/10* (2006.01)
(Continued)

(52) U.S. Cl.
CPC .............. *B25J 5/02* (2013.01); *B25J 9/1035* (2013.01); *B25J 11/0095* (2013.01); *H10P 72/0471* (2026.01); *H10P 72/3302* (2026.01)

(58) Field of Classification Search
CPC ... B25J 5/02; B25J 9/1035; H01L 21/672213; H01L 21/67742
(Continued)

(56) References Cited

U.S. PATENT DOCUMENTS

2014/0367587 A1 12/2014 McRay

FOREIGN PATENT DOCUMENTS

CN 211788912 U 10/2020
JP 10-135146 A 5/1998
(Continued)

OTHER PUBLICATIONS

International Search Report of PCT/JP2022/029754 dated Oct. 25, 2022 [PCT/ISA/210].

*Primary Examiner* — Michael Mccullough
*Assistant Examiner* — Jessica L Burkman
(74) *Attorney, Agent, or Firm* — Sughrue Mion, PLLC

(57) ABSTRACT

A substrate transfer device includes a shaft member rotationally movable about a rotation axis, a first swing member coupled to a holder for holding a substrate, a first support member supporting the first swing member to be linearly displaced, a second swing member having a linearly moving part linearly displaceable, and a second support member supporting the second swing member to be linearly displaced The first support member is rotationally moved about the rotation axis integrally with the second support member together with the second swing member being linearly displaced with respect to the second support member in a manner interlocked with a linear movement of the linearly moving part, and the first swing member is linearly displaced with respect to the first support member via the shaft member, such that the holder is linearly displaced.

10 Claims, 8 Drawing Sheets

(51) Int. Cl.
  *B25J 11/00*        (2006.01)
  *H10P 72/00*        (2026.01)
  *H10P 72/30*        (2026.01)

(58) Field of Classification Search
  USPC ...................................................... 414/744.2
  See application file for complete search history.

(56) References Cited

FOREIGN PATENT DOCUMENTS

| | | | | |
|---|---|---|---|---|
| JP | 2006-236746 | A | | 9/2006 |
| JP | 2009146865 | A | * | 7/2009 |
| KR | 10-2020-0115914 | A | | 10/2020 |

* cited by examiner

SUBSTRATE TRANSFER DEVICE

CROSS-REFERENCE TO RELATED APPLICATIONS

This Application is a national stage entry of International Application No. PCT/JP2022/029754, filed Aug. 3, 2022, in the Japanese Patent Office, which claims priority to Japanese Application No. 2021-144853, filed Sep. 6, 2021, in the Japanese Patent Office, the contents of each of which being herein incorporated by reference in their entireties.

BACKGROUND

Devices and apparatuses consistent with the present disclosure relate to a substrate conveyance device for transferring a substrate across an ion beam in a processing chamber of an ion implantation apparatus.

In an ion beam irradiation apparatus used in a semiconductor manufacturing process, a substrate transfer device is used to transfer a substrate across an ion beam in a processing chamber. As one example of such an apparatus, there is an ion beam irradiation apparatus disclosed in Japanese Publication of Patent Application JP 2006-236746 A.

The ion beam irradiation apparatus comprises a holder for holding a substrate; an arm supporting the holder; and an extension-retraction driving mechanism for extending and retracting the arm by an arm extension-retraction motor to reciprocatingly linearly drive the holder. The ion beam irradiation apparatus also comprises a swing driving mechanism for reciprocatingly swinging the arm within a given angular range about a swing axis located at a position away from the holder, by a swing motor for swinging the arm.

The ion beam irradiation apparatus further comprises a controller for controlling the arm extension-retraction motor and the swing motor such that the movement of the holder in the processing chamber becomes a reciprocating linear motion. The controller performs control to cause the holder which is just about being reciprocatingly moved to draw an arc-shaped trajectory by the swing driving mechanism, to be displaced by an appropriate distance along a direction toward the swing axis by the extension-retraction driving mechanism, thereby reciprocatingly linearly moving the holder.

However, the related art ion beam irradiation apparatus requires a complicated control for simultaneously interlocking two driving sources: the arm extension-retraction motor and the swing motor, such that the motion of the holder becomes a reciprocating linear motion. Moreover, it has been difficult to interlock these driving sources to reciprocatingly linearly move the holder in a rigorous manner.

It is therefore an aspect to provide a substrate transfer device capable of allowing a holder for holding a substrate to be reciprocatingly linearly moved by a single driving source, even if the substrate transfer device has a configuration for reciprocatingly swingingly moving the holder about a given rotation axis.

According to an aspect of one or more embodiments, there is provided a substrate transfer device equipped with a holder for holding a substrate to be irradiated with an ion beam, and configured to move the holder to be reciprocatingly linearly displaced between a holder-side first point and a holder-side second point, the substrate transfer device comprising a shaft member disposed at a position away from the holder and reciprocatingly rotationally movable within a given range about a given rotation axis; a linearly moving-side swing member having a linearly moving part on a one end side thereof, the linearly moving part being located at a position away from the shaft member and reciprocatingly linearly movable in one direction between a linearly moving-side first point and a linearly moving-side second point, wherein the other end side of the linearly moving-side swing member is disposed to lie close to the shaft member; a linearly moving-side support member supporting the linearly moving-side swing member in a state in which the linearly moving-side swing member is allowed to be linearly displaced within a given range, the linearly moving-side support member being rotationally movable about the rotation axis together with the linearly moving-side swing member; a holder-side swing member coupled to the holder on a one end side thereof, wherein the other end side of the holder-side swing member is disposed to lie close to the shaft member; a holder-side support member supporting the holder-side swing member in a state in which the holder-side swing member is allowed to be linearly displaced within a given range, the holder-side support member being rotationally movable about the rotation axis together with the holder-side swing member; a linearly moving-side conversion member interposed between the shaft member and the linearly moving-side swing member and configured to convert a linear displacement of the linearly moving-side swing member with respect to the linearly moving-side support member to a rotational movement of the shaft member; a holder-side conversion member interposed between the shaft member and the holder-side swing member and configured to convert a rotational movement of the shaft member to a linear displacement of the holder-side swing member with respect to the holder-side support member; and a driving source for generating a driving force to be transmitted directly or indirectly to the linearly moving-side support member to rotationally move the linearly moving-side support member, wherein the substrate transfer device is configured such that when the driving source generates the driving force, the linearly moving-side support member and the holder-side support member are rotationally moved integrally about the rotation axis, and the linearly moving-side swing member is linearly displaced with respect to the linearly moving-side support member in a manner interlocked with a linear displacement of the linearly moving part in the one direction, so that the shaft member is rotationally moved via the linearly moving-side conversion member, and the holder-side swing member is linearly displaced with respect to the holder-side support member via the holder-side conversion member.

According to this configuration, the linearly moving-side support member and the holder-side support member are reciprocatingly rotationally moved integrally about the given rotation axis. Further, the linearly moving-side swing member is configured to be rotationally moved together with the linearly moving-side support member, and the holder-side swing member is configured to be rotationally moved together with the holder-side support member. Thus, when a driving force generated from the driving source is transmitted directly or indirectly to the linearly moving-side support member, each of the linearly moving-side swing member and the holder-side swing member will be swingingly moved about the given rotation axis.

Simultaneously, the linearly moving part is linearly displaced in the one direction, and the linearly moving-side swing member is linearly displaced with respect to the linearly moving-side support member. Then, the linear motion of the linearly moving-side swing member is converted to a rotational motion via the linearly moving-side conversion member, and thereby the shaft member is rotationally moved. Simultaneously, the rotational motion of the shaft member is converted to a linear motion via the holder-side conversion member, and thereby the holder-side swing member is linearly displaced with respect to the holder-side support member. That is, the holder-side swing member and the linearly moving-side swing member are interlocked with each other through the rotational movement of the shaft member. Thus, a displacement amount by which the holder-side swing member is linearly displaced with respect to the holder-side support member is determined by a displacement amount by which the linearly moving-side swing member is linearly displaced with respect to the linearly moving-side support member.

The linearly moving-side swing member is lineally displaced with respect to the linearly moving-side support member in a manner interlocked with a linear displacement of the linearly moving part in the one direction. In other words, the linearly moving-side swing member is lineally displaced with respect to the linearly moving-side support member such that the linearly moving part on the one end side of the linearly moving-side swing member is always located on a single linear line along the one direction. Thus, the holder-side swing member will be lineally displaced with respect to the holder-side support member such that the holder coupled to the one end side of the holder-side swing member is always located on a single linear line.

As above, in the substrate transfer device according to various embodiments, the holder coupled to the holder-side swing member is displaced on a single linear line in a manner interlocked with the linear displacement of the linearly moving part. Thus, the holder will be reciprocatingly linearly displaced on a single linear line in a manner interlocked with the reciprocating linear displacement of the linearly moving part in the one direction. That is, the substrate transfer device according to various embodiments makes it possible to allow a holder for holding a substrate to be reciprocatingly linearly moved by a single driving source, even in a configuration intended to reciprocatingly swing the holder about the given rotation axis through the holder-side swing member In some embodiments, the substrate transfer device may comprise a ball screw which comprises a threaded shaft disposed along the one direction, and a nut linearly displaceable on the threaded shaft, wherein the driving source may be configured to drive the ball screw such that the linearly moving part is linearly displaceable in the one direction in a manner interlocked with the nut.

According to this configuration, the displacement of the linearly moving part can be controlled by controlling the driving of the ball screw which is generally easy to control. Thus, it is possible to easily control the the linearly moving part, and thus easily control the reciprocating linear motion of the holder.

In some embodiments, the rotation axis may be orthogonal to a traveling direction of the ion beam, and the holder-side swing member may be configured to be reciprocatingly swingingly displaced along a plane perpendicular to the rotation axis.

In some embodiments, the holder may comprise a platen on which the substrate is to be placed, wherein the platen may be configured to be rotationally moved within a given range about a platen rotation axis parallel to the rotation axis.

In some embodiments, the linearly moving-side conversion member may be a rack-and-pinion including a linearly moving-side rack disposed on the linearly moving-side swing member and a linearly moving-side pinion disposed on an outer periphery of the shaft member, and the holder-side conversion member may be a rack-and-pinion including a holder-side rack disposed on the holder-side swing member and a holder-side pinion disposed on an outer periphery of the shaft member.

In some embodiments, the shaft member may be configured such that a ratio of a displacement amount of the linearly moving-side rack to a displacement amount of the holder-side rack is consistent with a ratio of a distance from the linearly moving part to the rotation shaft to a distance from the platen rotation axis to the rotation shaft.

In some embodiments, the holder and a portion of the holder-side swing member may be disposed to be exposed to an inside of a processing chamber set to a high-vacuum state, wherein the holder-side swing member may be formed in a cylindrical shape having an internal space, and an electrical cable or a tube led from outside may be disposed to reach inside the holder through the internal space.

According to this configuration, an electrical cable or a tube can be led to the holder through the inside of the substrate transfer device, so that the electrical cable or the tube is prevented from exposure to an ion beam. Thus, degradation of or damage to the electrical cable or the tube is suppressed.

In a substrate transfer device according to various embodiments, it is possible for the holder to be reciprocatingly linearly moved by a single driving source.

DETAILED DESCRIPTION

First, a substrate transfer device 10, and an ion beam irradiation apparatus 100 using the substrate transfer device 10 will are described.

Figure 1:
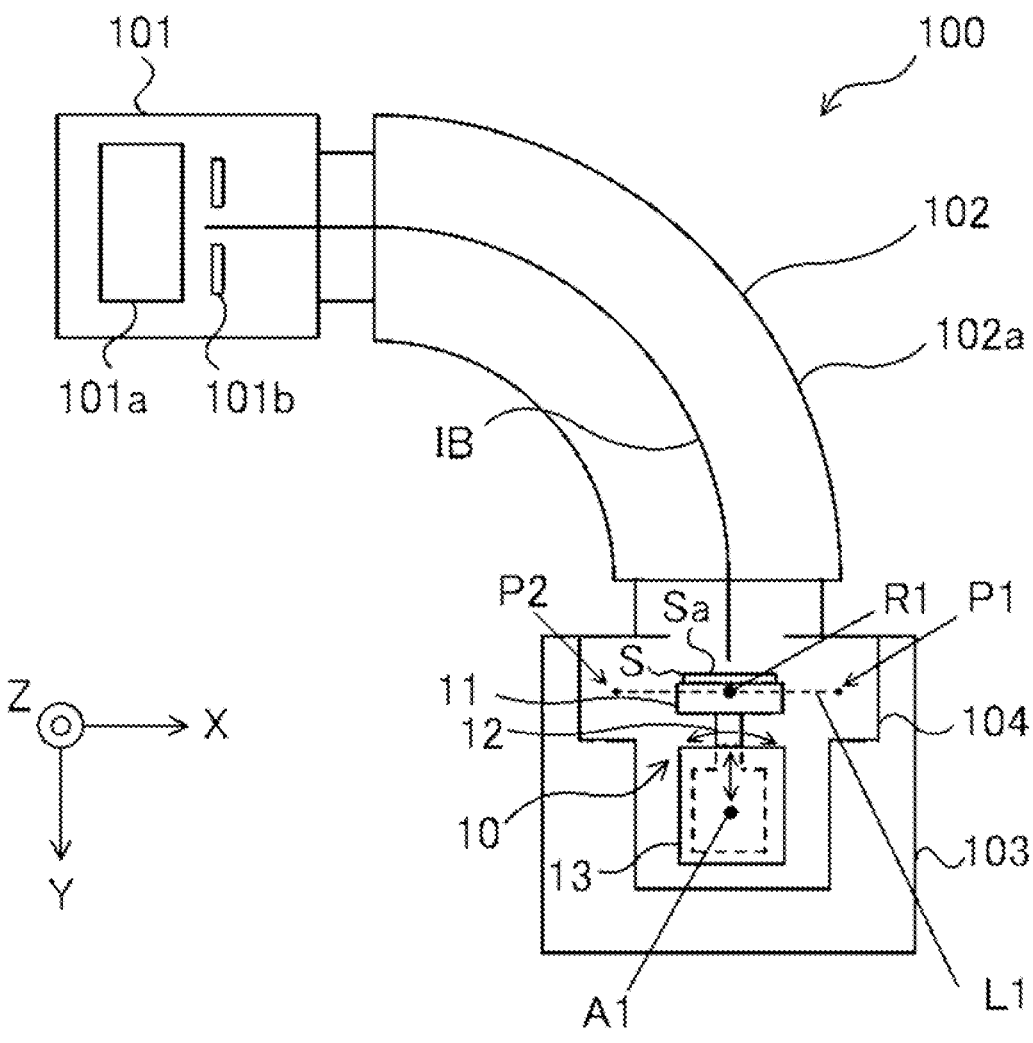
FIG. 1 is a schematic plan view showing an ion beam irradiation apparatus in which a substrate transfer device according to an embodiment is disposed.

FIG. 1 is a plan view schematically showing a configuration of the ion beam irradiation apparatus 100, according to an embodiment. The ion beam irradiation apparatus 100 may be an ion implantation apparatus used in a semiconductor manufacturing process.

As shown in FIG. 1, the ion beam irradiation apparatus 100 is an apparatus for performing ion implantation processing for a substrate S which is a semiconductor wafer by irradiating a to-be-processed surface Sa of the substrate S with an ion beam IB. The ion beam irradiation apparatus 100 comprises an ion source 101 for generating the ion beam IB, a transport device 102 for transporting the ion beam IB, and an end station 103 in which an ion implantation processing for the substrate S is performed.

The ion source 101 has a plasma chamber 101a in which a plasma is generated from a raw material supplied from the outside the ion source 101. The ion source unit 101 also comprises an extraction electrode 101b for extracting ions contained in the plasma generated in the plasma chamber 101a, as the ion beam IB. As the ion source 101, a configuration widely used in ion beam irradiation apparatuses is employed, and therefore detailed description thereof will be omitted for conciseness.

The transport device 102 comprises a mass analysis magnet 102a for mass-separating the ion beam IB extracted from the plasma chamber 101a to cause desired ions to reach the substrate S. As the transport device 102, a configuration widely used in ion beam irradiation apparatuses is employed, and therefore detailed description thereof will be omitted for conciseness.

The end station 103 comprises a processing chamber 104 in which the substrate S is irradiated with the ion beam IB. The inside of the processing chamber 104 is evacuated and maintained in a high-vacuum state during operation of the ion beam irradiation apparatus 100. A substrate transfer device 10 is disposed inside the end station 103 to transfers the substrate S in the processing chamber 104. Within the end station 103, the outside of the processing chamber 104 is placed under atmospheric pressure.

In the ion beam irradiation apparatus 100, during a period during which the substrate S is reciprocated one or more times, the substrate S is moved across the ion beam IB to cause the to-be-processed surface Sa of the substrate S to be exposed to the ion beam IB. Thus, ion implantation processing is applied to the substrate S. In some embodiments, the ion beam IB may be a ribbon beam having a vertical length dimension greater than a horizontal length dimension in terms of a cross-section with respect to a traveling direction of the ion beam IB. However, embodiments are not limited thereto and, in some embodiments, the shape of the ion beam IB may be changed.

The substrate transfer device 10 comprises a holder 11 for holding the substrate S. The substrate transfer device 10 moves the holder 11 which holds the substrate S, thereby reciprocatingly linearly displacing the substrate S within a given range in the processing chamber 104. In other words, the substrate transfer device 10 moves the holder 11 linearly back and forth within the given range in the processing chamber 104. In some embodiments, the substrate transfer device 10 is configured to cause the holder 11 to perform a reciprocating linear displacement, i.e., to be linearly displaced in a reciprocating manner, between a holder-side first point P1 and a holder-side second point P2 along a first linear line L1, as illustrated in FIG. 1.

More particularly, the substrate transfer device 10 has a first arm 12 which is a holder-side swing member coupled to the holder 11. The first arm 12 is configured to be swingingly movable within a given angular range about a given rotation axis A1 whose position with respect to the processing chamber 104 is fixed. The substrate transfer device 10 is also configured to displace the holder 11 in parallel with the first linear line L1 by moving the first arm 12 along a direction toward the rotation axis A1 while swingingly displacing the first arm 12 within a given angular range about the rotation axis A1.

The end station 103 also comprises a load lock chamber (not illustrated) connected to the processing chamber 104 and a conveyance device (not illustrated) for conveying the substrate S. As the end station 103, except that the substrate transfer device 10 is disposed therein, a configuration commonly used in ion beam irradiation apparatuses is employed, and therefore detailed description thereof will be omitted for conciseness.

The substrate transfer device 10 is configured to operate such that a platen rotation axis R1 is always located on the first linear line L1, as will be described in detail later. The substrate transfer device 10 interlocks the swing motion of the first arm 12 which is the holder-side swing member, about the rotation axis A1, with the linear displacement of the first arm 12 along the direction toward the rotation axis A1 by a mechanical structure. This configuration allows the substrate transfer device 10 to avoid the complicated control which is required in the related art substrate transfer device.

In FIGS. 1-6, a direction along which the substrate S is transferred in the processing chamber 104, i.e. the first linear line L1, is parallel to the X-direction illustrated in each figure. Further, the traveling direction of the ion beam IB in the processing chamber 104 is consistent with the Y-direction. Further, FIGS. 1-6 are created for the first purpose of facilitating understanding of various embodiments, and therefore the shape, dimensional ratio, etc., of each component are not exactly coincident in each figure. The traveling direction of the ion beam IB means a direction along which the ion beam IB travels as viewed from the vertical direction. For example, if the ion beam IB is traveling parallel to the Y-direction on the X-Y plane, the traveling direction of the ion beam IB may be taken as the Y-direction even when the ion beam IB is traveling in a state in which the ion beam IB inclines upwardly or downwardly in the Z-direction on the Y-Z plane.

Figure 2:
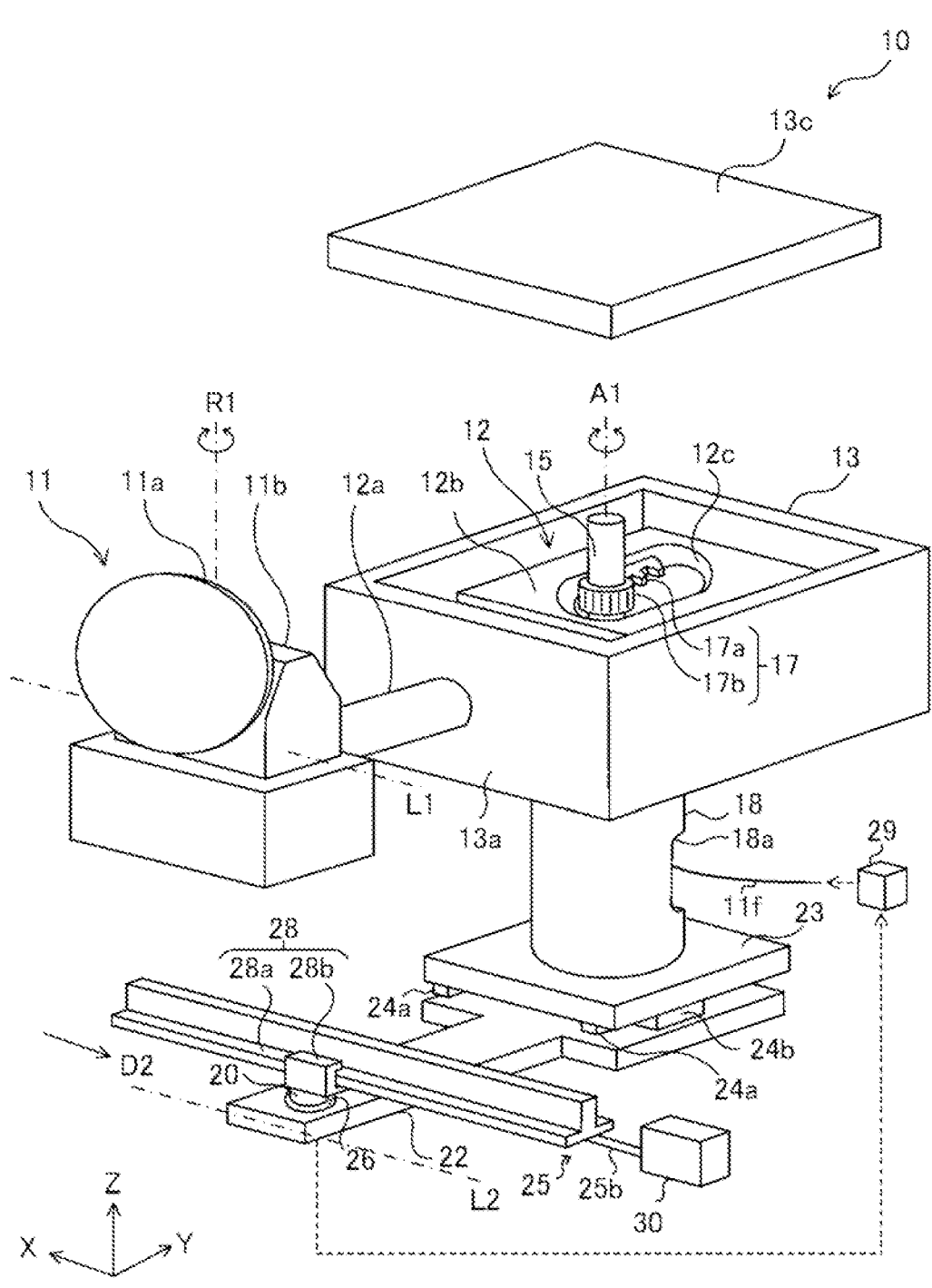
FIG. 2 is perspective view showing the substrate transfer device of FIG. 1 in more detail, according to an embodiment.
Figure 3:
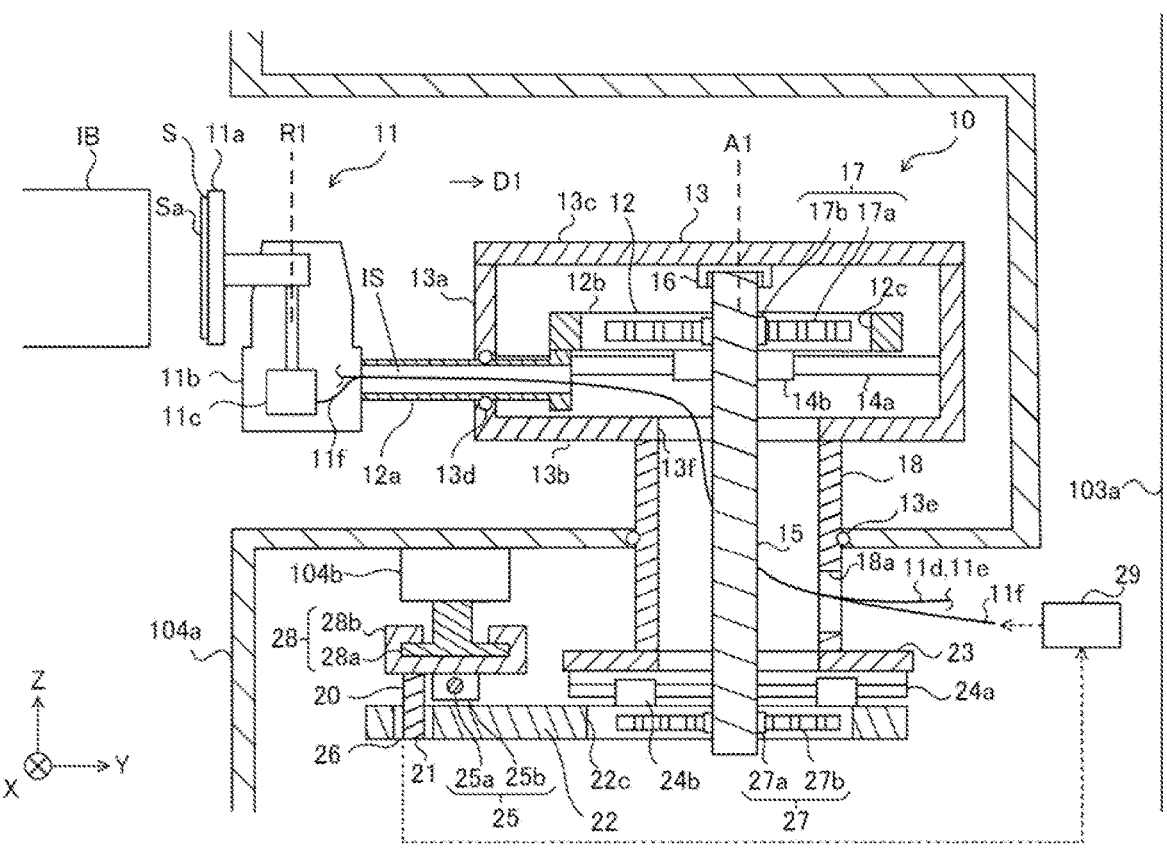
FIG. 3 is a vertical cross-sectional view of the substrate transfer device of FIG. 2, according to an embodiment.

A detailed configuration of the substrate transfer device 10 according to some embodiments will be described. FIG. 2 is a perspective view of the substrate transfer device 10, according to some embodiments. In FIG. 2, the substrate transfer device 10 is illustrated in a state in which a lid 13c of a first support 13 is removed to show an internal structure of the substrate transfer device 10. FIG. 3 is a vertical sectional view of the substrate transfer device 10 according to some embodiments, in which a portion of an inner wall surface 103a of the end station 103 and a portion of a chamber wall 104a of the processing chamber 104 are also shown. Since the holder 11 in some embodiments adopts a configuration that is widely known in ion beam irradiation apparatuses, an internal structure of the holder 11 is simplified in FIG. 3 for conciseness and simplicity of explanation.

As shown in FIG. 2, the substrate transfer device 10 comprises the holder 11 for holding the substrate S. The holder 11 comprises a disk-shaped platen 11a on which the substrate S is placed, and a driving device 11b for moving the platen 11a.

As shown in FIG. 3, a platen driving motor 11c is disposed in a housing of the driving device 11b to rotationally move the platen 11a within a given angular range about a platen rotation axis R1. The substrate transfer device 10 also has a platen driving motor controller 29 for controlling the platen driving motor 11c such that the orientation of the to-be-processed surface Sa with respect to the ion beam IB is kept constant during a period in which the substrate S moves across the ion beam IB. Further, the platen rotation axis R1 in some embodiments is parallel to the Z-direction which is the vertical direction, and is orthogonal to the first linear line L1 and the traveling direction of the ion beam IB.

Returning to FIG. 2, the first linear line L1 is defined by a displacement trajectory of the holder 11 or a displacement trajectory of the substrate S held by the holder 11. In some embodiments, the first linear line L1 is defined as a line overlapping the displacement trajectory of the platen rotation axis R1 on the X-Y plane. In other words, the substrate transfer device 10 is configured to operate such that the platen rotation axis R1 is always located on the first linear line L1 in top view.

As shown in FIG. 2, the substrate transfer device 10 comprises a shaft member 15 disposed at a position separated from from the holder 11. The shaft member 15 reciprocatingly rotates within a given range about the given rotation axis A1. The shaft member 15 is positioned such that the rotation axis A1 is parallel to the platen rotation axis R1.

The substrate transfer device 10 further comprises the first arm 12 which is the holder-side swing member. The first arm 12 is coupled to the holder 11 at a first end side of the first arm 12. Further, a second end side of the first arm 12 is disposed to lie close to the shaft member 15. For example, the first end side may be considered a distal end of the first arm 12, and the second end side may be considered a proximal end of the first arm 12.

Here, the terms "first end side" and "second end side" of the first arm 12 are intended to define a relative positional relationship between them. Thus, a position where the first arm 12 and the holder 11 are coupled together is not limited to a specific position, and a positional relationship between the first arm 12 and the shaft member 15 is not limited to a specific positional relationship. Further, a state in which the second end side of the first arm 12 is disposed to lie close to the shaft member 15 may be taken as meaning a state in which the first arm 12 and the shaft member 15 are spaced apart from each other to allow a holder-side conversion member 17 to be described later to be interposed therebetween.

The first arm 12 includes a hollow cylindrical portion 12a coupled to the driving device 11b at a distal end of the hollow cylindrical portion 12a, and a plate portion 12b fixed to an upper surface at a proximal end of the hollow cylindrical portion 12a. The plate portion 12b is formed of a rectangular plate material in plan view, and is formed with an opening 12c that opens in a plate thickness direction of the plate portion 12b.

As shown in FIGS. 2 and 3, the substrate transfer device 10 comprises a first support 13 supporting the first arm 12, which is a holder-side support member. The first support 13 is formed in an internally hollowed box form having a generally approximately rectangular parallelepiped shape, by four sidewalls 13a positioned to surround the plate portion 12b, a bottom wall 13b having a partial area opened in the plate thickness direction, and a lid 13c. In other words, in some embodiments, the first support 13 may be a hollow box formed by the four sidewalls 13a, the bottom wall 13b, and the lid 13c.

The shaft member 15 is disposed to pass through the opening 12c and an opening 13f formed in the bottom wall 13b, and is rotatably supported by a bearing 16 fixed to a bottom surface of the lid 13c. Further, the first arm 12 is disposed such that the hollow cylindrical portion 12a is inserted in an opening in a thickness direction of a sidewall 13a that faces the driving device 11b so as to penetrate through the sidewall 13a in a thickness direction thereof.

Figure 5A:
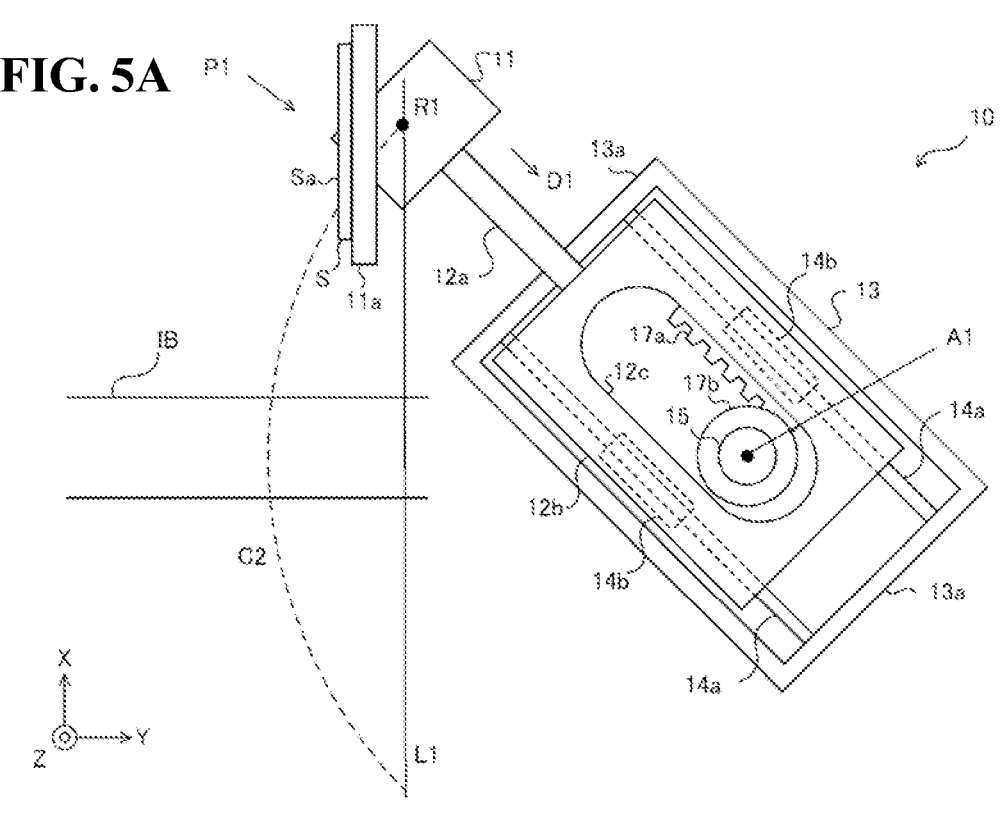
FIG. 5A is a schematic diagram showing a state in which a holder of the substrate transfer device is located at a holder-side first point, according to an embodiment.
Figure 5B:
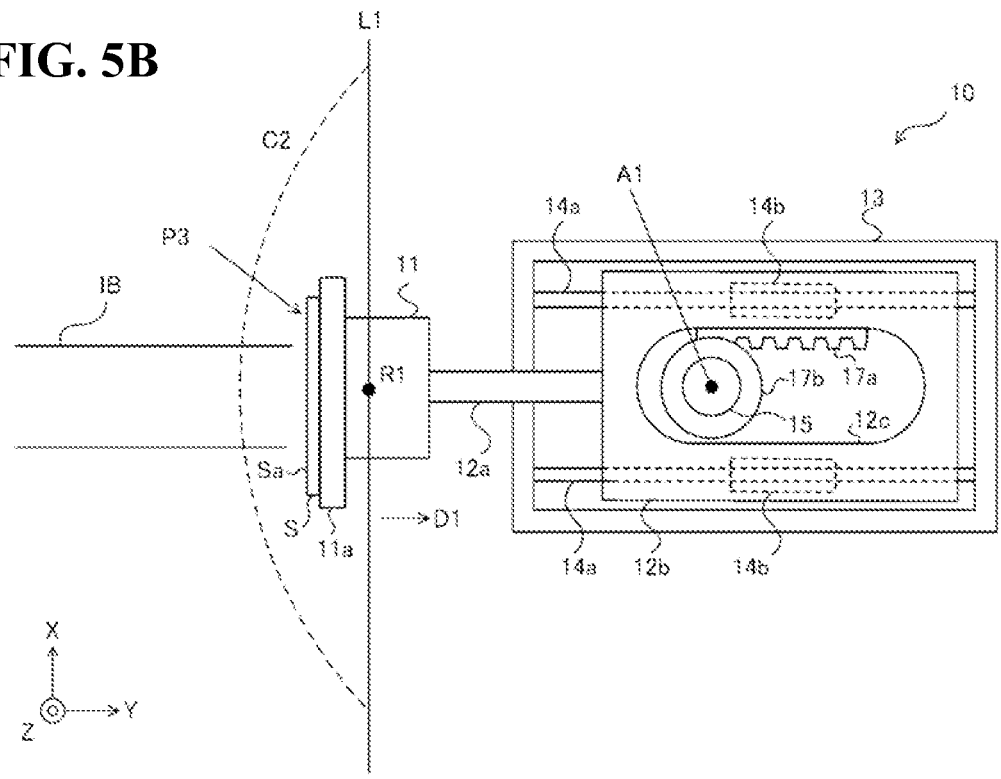
FIG. 5B is a schematic diagram showing a state in which the holder of the substrate transfer device is located at a holder-side intermediate point, according to an embodiment.
Figure 5C:
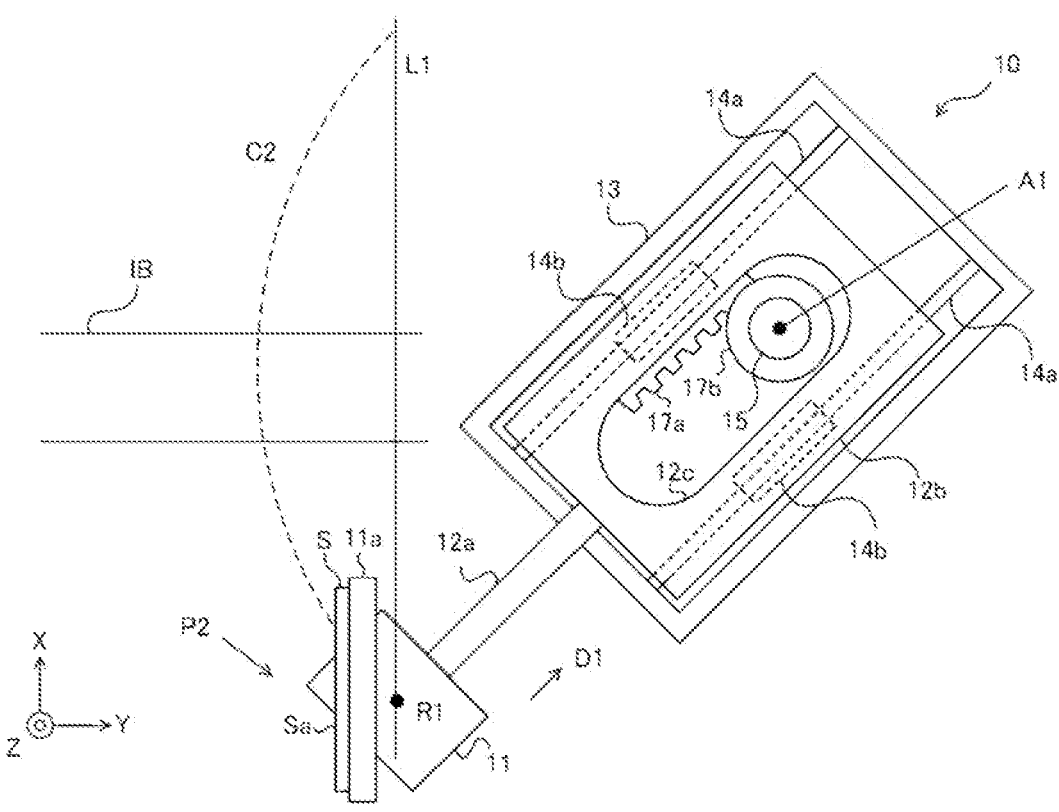
FIG. 5C is a schematic diagram showing a state in which the holder of the substrate transfer device is located at a holder-side second point, according to an embodiment.

As shown in FIGS. 3 and 5A-5C, a pair of elongated holder-side rail members 14a are arranged inside the first support 13 to extend parallel to a longitudinal direction of the hollow cylindrical portion 12a and connect the opposed sidewalls 13a together (best seen in FIGS. 5A-5C). For example, in some embodiments, the pair of elongated holder-side rail members 14a may include two elongated holder-side rail members 14a as illustrated in FIGS. 5A-5C. More specifically, the pair of holder-side rail members 14a are arranged to be parallel to a first direction D1 which is a direction orthogonal to the rotation axis A1 and the platen rotation axis R1.

As shown in FIGS. 5A-5C, the first direction D1 is a direction directed from the platen rotation axis R1 toward the rotation axis A1. However, since the platen rotation axis R1 is displaced in a manner interlocked with the displacement of the holder 11, the first direction D1 is a relative direction defined by the rotation axis A1 and the platen rotation axis R1.

As shown in FIGS. 3 and 5A-5C, holder-side guide members 14b are each slidingly movable on a respective one of the holder-side rail members 14a and are fixed to a lower surface of the plate portion 12b of the first arm 12. The holder-side rail members 14a and the holder-side guide members 14b restrict displacement in directions other than the first direction D1.

That is, the first support 13 supports the first arm 12 while allowing the first arm 12 to be linearly displaced along the first direction D1 within a given range with respect to the first support 13. Further, the first support 13 is configured to be rotationally movable about the rotation axis A1 together with the first arm 12.

As shown in FIGS. 2 and 3, the substrate transfer device 10 comprises a holder-side conversion member 17 interposed between the shaft member 15 and the first arm 12 and configured to move the shaft member 15 and the first arm 12 in an interlocked manner. The holder-side conversion member 17 converts the rotational motion of the shaft member 15 about the rotation axis A1 into a linear motion of the first arm 12 along the first direction D1.

The holder-side conversion member 17 in the substrate transfer device 10 may be a rack-and-pinion including a first rack 17a which is a holder-side rack, and a first pinion 17b which is a holder-side pinion. The first rack 17a is an elongated plate material formed with a plurality of teeth, and is fixed to an inner peripheral surface of the opening 12c formed in the first arm 12. The first pinion 17b is a gear-shaped member meshed with teeth formed in the first rack 17a, and is fixed to an outer peripheral surface of an upper end of the shaft member 15 such that the first pinion 17b is rotationally movable about the rotation axis A1 integrally with the shaft member 15. It should be noted here that the holder-side conversion member is not limited to a rack-and-pinion.

As shown in FIG. 2, the substrate transfer device 10 comprises a second arm 22 disposed below the holder 11 and the first support 13, which is a linearly moving-side swing member. As shown in FIG. 3, the second arm 22 has, on a distal end of the second arm 22, a linearly moving part 21 which is reciprocatingly linearly movable within a given range along a second direction D2 orthogonal to the rotation axis A1 at a position spaced apart from the shaft member 15.

In some embodiments, a configuration for causing the distal end of the second arm 22 to be linearly displaced may be omitted. Further, the linear movement part 21 may be defined as a specific component, or may be defined as a point or an area that is present on the distal end of the second arm 22 and that is linearly displaceable along the second direction D2. In some embodiments, the second direction D2 is set to be coincident with the X direction. Hoverer, embodiments are not limited thereto.

The second arm 22 is disposed such that the proximal end of the second arm 22 lies close to the shaft member 15.

Here, the terms "distal end" and "proximal end" of the second arm 22 are intended to define a relative positional relationship between them. Thus, a position of the linearly moving part 21 in the second arm 22 is not limited to a specific position, and a positional relationship between the second arm 22 and the shaft member 15 is not limited to a specific positional relationship. Further, a state in which the proximal end of the second arm 22 is disposed to lie close to the shaft member 15 may be taken as meaning a state in which the second arm 12 and the shaft member 15 are spaced apart from each other to allow a linearly moving-side conversion member 27 to be described later to be interposed therebetween.

The substrate transfer device 10 comprises a second support 23 that supports the second arm 22. The second support 23 may be a linearly moving-side support member. In some embodiments, the second support 23 may be formed of a plate material. In some embodiments, the second support 23 may be formed in a box form receiving the second arm 22 therein, in a similar manner to that for the first support 13.

Figure 4A:
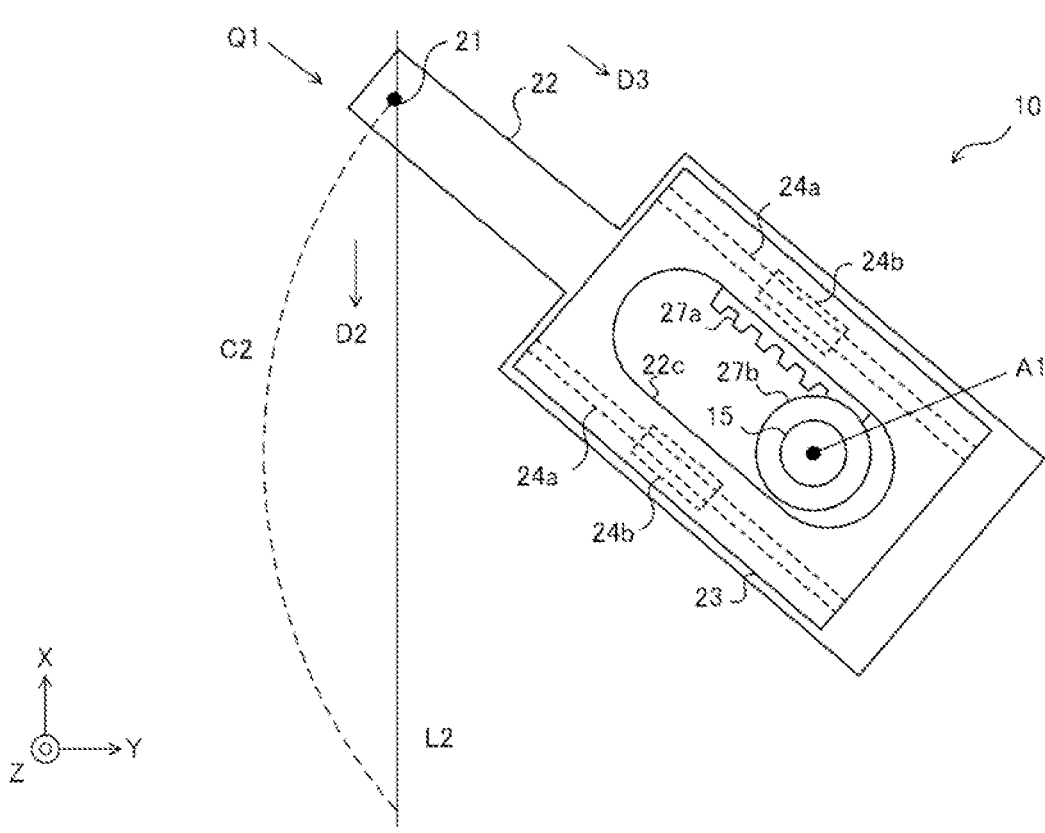
FIG. 4A is a schematic diagram showing a state in which a linearly moving part of the substrate transfer device is located at a linearly moving-side first point, according to an embodiment.
Figure 4B:
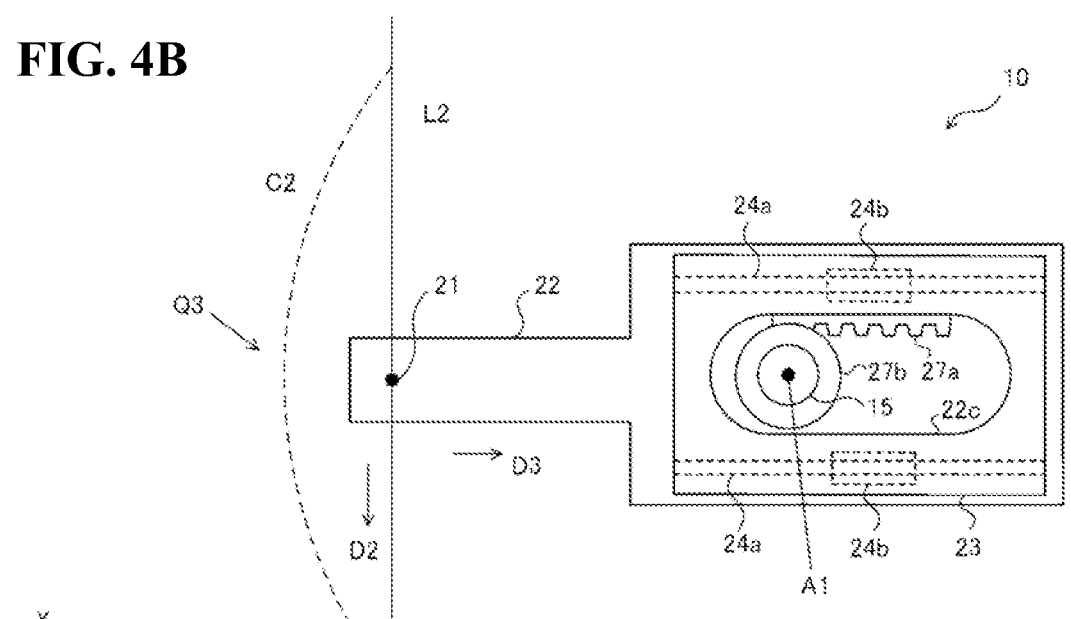
FIG. 4B is a schematic diagram showing a state in which the linearly moving part of the substrate transfer device is located at a linearly moving-side intermediate point, according to an embodiment.
Figure 4C:
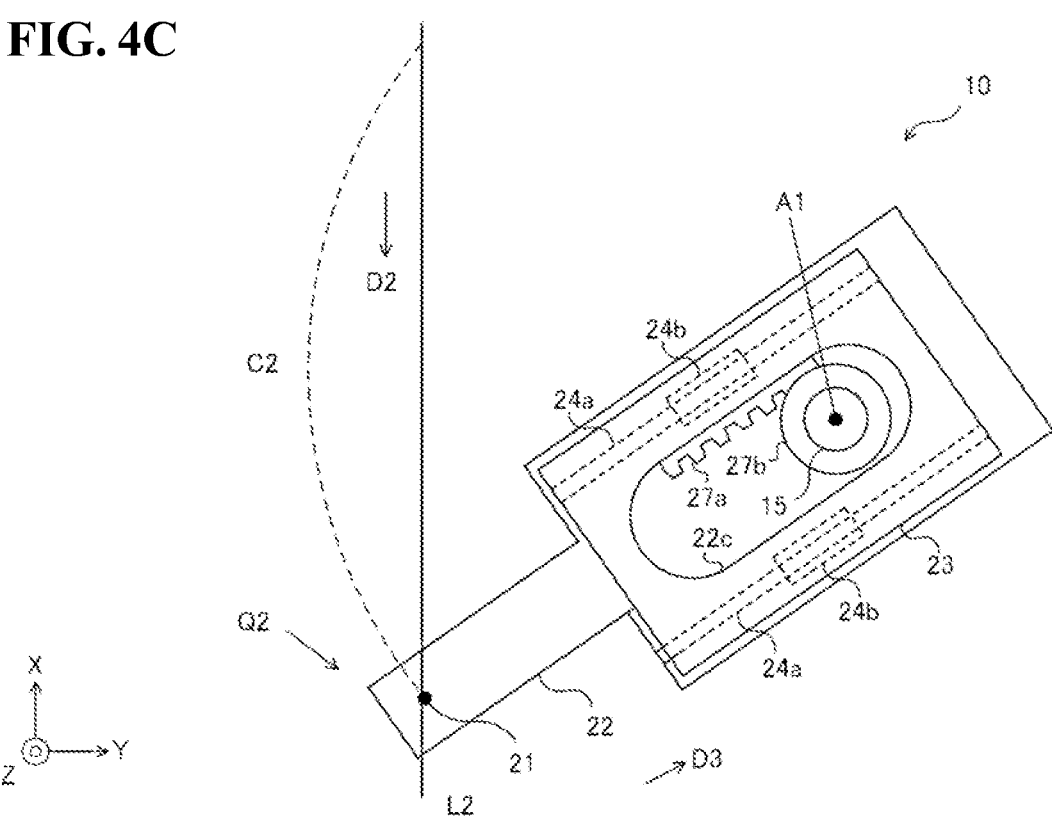
FIG. 4C is a schematic diagram showing a state in which the linearly moving part of the substrate transfer device is located at a linearly moving-side second point, according to an embodiment.

As shown in FIGS. 3 and 4A-4C, a pair of elongate linearly moving-side rail members 24a are arranged on a lower surface of the second support 23 to extend parallel to a third direction D3 directed from the linearly moving part 21 toward the rotation axis A1. In some embodiments, the pair of elongate linearly moving-side rail members 24a may include two elongate linearly moving-side rail members 24a, as illustrated in FIGS. 4A-4C. The third direction D3 is a relative direction defined by the linearly moving part 21 which is linearly displaced with respect to the rotation axis A1. Further, linearly moving-side guide members 24b each slidingly movable on a respective one of the linearly moving-side rail members 24a are fixed to an upper surface on the proximal end of the second arm 22. The linearly moving-side rail members 24a and the linearly moving-side guide members 24b restrict displacement in directions other than the third direction D3.

That is, the second support 23 supports the second arm 22 while allowing the second arm 22 to be linearly displaced along the third direction D3 within a given range with respect to the second support 23. Further, the second support 23 is configured to be rotationally movable about the rotation axis A1 together with the second arm 22.

As shown in FIGS. 2 and 3, a hollow cylindrical coupling member 18 is disposed between the first support 13 and the second support 23. In some embodiments, the first support 13, the second support 23 and the hollow cylindrical coupling member 18 may be fixed to each other such that the first support 13, the second support 23 and the hollow cylindrical coupling member 18 are rotationally moved about the rotation axis A1 integrally. In some embodiments, all or a part of the first support 13, the coupling member 18 and the second support 23 may be preliminarily formed integrally.

As shown in FIG. 2, the substrate transfer device 10 comprises a linear movement guide 28 for causing the linearly moving part 21 of the second arm 22 to be linearly displaced. As shown in FIG. 3, the linear movement guide 28 is fixed to the outside of the chamber wall 104a of the processing chamber 104 through a fixed member 104b. The linear movement guide 28 includes a guide rail 28a, and a guide block 28b which is slidingly displaceable on the guide rail 28a in one direction. The guide rail 28 a is disposed along the second direction D2, so that the guide block 28b is configured to be linearly displaceable along the second direction D2.

In the substrate transfer device 10 according to some embodiments, the guide block 28b is driven by a ball screw 25. As shown in FIG. 3, the ball screw 25 comprises a threaded shaft 25a, and a nut 25b linearly movable on the threaded shaft 25a. The threaded shaft 25a is disposed along the guide rail 28a, i.e. along the second direction D2.

As shown in FIG. 2, the substrate transfer device 10 comprises a driving source 30 which is a rotary motor for generating a driving force for driving the ball screw 25. In some embodiments, the driving source 30 is configured to firstly drive the ball screw 25. However, it is only necessary that the drive force be transmitted to the second support 23 to rotate the second support 23. Thus, the driving source 30 may be configured to directly transmit or indirectly transmit the driving force to the second support 23 as long as the driving force may be transmitted to the second support to rotationally move the second support 23. Further, since the first support 13 and the second support 23 are configured to move integrally, the driving source 30 may be taken as means to transmit a driving force directly or indirectly to the first support 13 or the second support 23.

A columnar linearly-moving shaft member 20 is fixed to the guide block 28b. An upper end of the linearly-moving shaft member 20 is fixed to the guide block 28b, so that the linearly-moving shaft member 20 is configured to be linearly displaceable along the second direction D2 integrally with the guide block 28b. On the other hand, a lower end of the linearly-moving shaft member 20 is disposed on the distal end of the second arm 22 through a bearing 26.

Thus, when the guide block 28b is linearly displaced on the guide rail 28a, the linearly moving part 21 will be linearly displaced in the second direction D2 in a manner interlocked with the linearly-moving shaft member 20. Here, the linearly-moving shaft member 20 is supported in a rotationally movable manner with respect to the second arm 22 via the bearing 26. Thus, when the linearly moving part 21 is linearly displaced, the second arm 22 moves such that the second arm 22 is swingingly displaced about the rotation axis A1 while shifting the position of the proximal end of the second arm 22 with respect to the rotation axis A1. The linearly moving part 21 in some embodiments may be taken as an area in which the linearly-moving shaft member 20 in the second arm 22 is supported.

As shown in FIG. 3, the substrate transfer device 10 comprises a linearly moving-side conversion member 27 interposed between the shaft member 15 and the second arm 22 and configured to move the shaft member 15 and the second arm 22 in an interlocked manner. The linearly moving-side conversion member 27 converts the linear motion of the second arm 22 with respect to the second support 23 to a rotational motion about the rotation axis A1 of the shaft member 15.

The linearly moving-side conversion member 27 is a rack-and-pinion including a second rack 27a which is a linearly moving-side rack, and a second pinion 27b which is a linearly moving-side pinion. The second rack 27a is an elongated plate material formed with a plurality of teeth, and is fixed to an inner peripheral surface of an opening 22c formed on the other end side of the second arm 22. The second pinion 27b is a gear-shaped member meshed with teeth formed in the second rack 27a, and is fixed to an outer peripheral surface of a lower side of the shaft member 15 such that the second pinion 27b is rotationally movable about the rotation axis A1 integrally with the shaft member 15. It should be noted here that the linearly moving-side conversion member is not limited to a rack-and-pinion.

As shown in FIG. 3, in the substrate transfer device 10, a first seal member 13d is disposed between the cylindrical portion 12a and the sidewall 13a. The first seal member 13d prevents air in the end station 103 from flowing into the processing chamber 104 through a gap between the opening of the sidewall 13a and the cylindrical portion 12a. Further, a second seal member 13e is disposed between the coupling member 18 and the chamber wall 104a to prevent air from flowing into the processing chamber 104 through a gap between the coupling member 18 and the chamber wall 104a.

That is, in the ion beam irradiation apparatus 100 according to some embodiments, the substrate transfer device 10 is configured such that only the holder 11 and a portion of the cylindrical portion 12a located outside the sidewall 13a are positioned within the processing chamber 104 whose inside is maintained in a high-vacuum state. On the other hand, each component of the substrate transfer device 10, except for the holder 11 and a portion of the cylindrical portion 12a located outside the sidewall 13a, is isolated from the processing chamber 104 by the first support 13 and the coupling member 18, and is placed under atmospheric pressure in the end station 103. Thus, even when the substrate transfer device 10 is operated, the operation does not exert any influence on the degree of vacuum in the processing chamber 104. Further, even if particles are generated along with the operation of the substrate transfer device 10, such particles are prevented from flowing into the processing chamber 104.

As shown in FIG. 3, an electrical cable 11d which is a power cable or a signal line for driving a device disposed inside the holder 11, and a tube 11e through which a cooling medium for cooling the holder 11 flows, are led to the inside of the first support 13 and the holder 11 from the outside of the substrate transfer device 10. Further. as shown in FIGS. 2 and 3, a platen driving signal line 11f, which is a signal line for transmitting a signal for controlling the platen driving motor 11c from the platen driving motor controller 29 to the platen driving motor 11c, is also disposed to reach the holder 11 through the inside of the first support 13.

As shown in FIG. 3, the coupling member 18 has a routing opening 18a formed in an area located outside the processing chamber 104 by cutting out a portion of the sidewall of the coupling member 18.

The electrical cable 11d, the tube 11e and the platen driving signal line 11f are bundled, and routed such that the electrical cable 11d, the tube 11e and the platen driving signal line 11f are led to the inside of the first support 13 through the routing opening 18a, and reach the inside of the holder 11 through an internal space IS of the cylindrical portion 12a. Since the electrical cable 11d, the tube 11e and the platen driving signal line 11f are led to the holder 11, through the internal space of the substrate transfer device 10, i.e., without being exposed to the ion beam IB, degradation of and damage to the electrical cable 11d, the tube 11e and the platen driving signal line 11f may be suppressed.

As illustrated in FIGS. 2 and 4A-4C, the substrate transfer device 10 is configured to control the driving source 30 such that the nut 25b of the ball screw 25 is reciprocatingly moved within a given range, thereby causing the linearly moving part 21 to be reciprocatingly displaced between the linearly moving-side first point Q1 and the linearly moving-side second point Q2. In some embodiments, the linearly moving part 21 is displaced on the second linear line L2 illustrated in FIGS. 2 and 4A-4C.

As shown in FIG. 4A, when a driving force is generated from the driving source 30 when the linearly moving part 21 is located at the linearly moving-side first point Q1, the ball screw 25 is driven and thus the linearly-moving shaft member 20 starts moving, so that the linearly moving part 21 starts to be displaced in the second direction D2 in a manner interlocked with the movement of the linearly-moving shaft member 20. Then, the second arm 22 starts moving about the rotation axis A1 while being displaced in the third direction D3 with respect to the second support 23. At this time, the second rack 27a starts moving to rotate the second pinion 27b while being displaced in the third direction D3 with respect to the rotation axis A1, and the second arm 22 starts swingingly moving about the rotation axis A1. Simultaneously, the shaft member 15 also starts rotationally moving about the rotation axis A1, together with the second pinion 27b.

Subsequently, as shown in FIG. 4B, when the linearly moving part 21 reaches the linearly moving-side intermediate point Q3 which is an intermediate point between the linearly moving-side first point Q1 and the linearly moving-side second point Q2, the second rack 27a reverses a displacement direction with respect to the rotation axis A1 and then starts moving again to rotate the second pinion 27b in the opposite direction to the previous direction. Then, as shown in FIG. 4C, when the linearly moving part 21 reaches the linearly moving-side second point Q2, the linearly moving part 21 reverses the displacement direction and them moves to return to the linearly moving-side first point Q1 again.

Further, during a period in which the linearly moving part 21 reaches the linearly moving-side second point Q2 from the linearly moving-side first point Q1, the second arm 22 performs a swing movement about the rotation axis A1. This swing movement of the second arm 22 is transmitted to the second support 23 via the linearly moving-side rail members 24a and the linearly moving-side guide members 24b, so that the second support 23 performs a swing movement about the rotation axis A1 in a manner interlocked with the linear displacement of the linearly moving part 21.

More specifically, along with the swing movement of the second arm 22, the linearly moving-side guide members 24b fixed to the second arm 22 swingingly moves the linearly moving-side rail members 24a while being slidingly displaced on the linearly moving-side rail members 24a. As a result, the second support 23 to which the linearly moving-side rail members 24a are fixed is rotationally moved about the rotation axis A1.

It should be noted that since respective movements of the second arm 22 and the second support 23 when the linearly moving part 21 is displaced from the linearly moving-side second point Q2 to the linearly moving-side first point Q1 are opposite to those when the linearly moving part 21 is displaced from the linearly moving-side first point Q1 to the linearly moving-side second point Q2, description thereof will be omitted for conciseness.

The above-mentioned movements of the second arm 22 and the second support 23 are reflected on respective movements of the first arm 12 and the first support 13.

As illustrated in FIG. 5A, when the linearly moving part 21 is located at the linearly moving-side first point Q1, the holder 11 is located at the holder-side first point P1. When the linearly moving part 21 starts moving from the linearly moving-side first point Q1, the first support 13 starts rotating about the rotation axis A1 integrally with the second support 23, as shown in FIG. 5A.

On the other hand, when the shaft member 15 starts rotating, the first pinion 17b rotates to displace the first rack 17a in the first direction D1, so that the first arm 12 starts to be displaced with respect to the first support 13 in the first direction D1. That is, the holder 11 starts to be displaced along the first direction D1 such that it approaches the rotation axis A1. Further, in response to driving by the platen driving motor 11c, the platen 11a starts to be rotationally moved about the platen rotation axis R1 such that orientation of the to-be-processed surface Sa of the substrate S with respect to the ion beam IB becomes constant.

Subsequently, as shown in FIG. 5B, when the linearly moving part 21 reaches the linearly moving-side intermediate position Q3, the holder 11 reaches the holder-side intermediate position P3. At this time, as the rotation direction of the shaft member 15 is reversed as mentioned above, the rotation direction of the first pinion 17b is also reversed, and starts moving to change a direction along which the first rack 17a is displaced. That is, the holder 11 starts to be displaced away from the rotation axis A 1 along the first direction D1. Then, as shown in FIG. 5C, at the same time when the linearly moving part 21 reaches the linearly moving-side second point Q2, the holder 11 reaches the holder-side second point P2.

Then, the holder 11 is displaced from the holder-side second point P2 to the holder-side first point P1 in a manner interlocked with displacement of the linearly moving part 21 from the linearly moving-side second point Q2 toward the linearly moving-side first point Q1. By displacing the holder 11 between the holder-side first point P1 and the holder-side second point P2 in this manner, the substrate S held by the holder 11 is transferred across the ion beam IB, and the to-be-processed surface Sa is exposed to the ion beam IB.

In this way, in the substrate transfer device 10 according to some embodiments, the second support 23 and the first support 13 are rotationally moved about the rotation axis A1 integrally in a manner interlocked with the linear displacement of the linearly moving part 21 in the second direction D2. At the same time, when the second arm 22 is linearly displaced with respect to the second support 23 in a manner interlocked with the linear displacement of the linearly moving part 21 in the second direction D2, the shaft member 15 is rotationally moved via the linearly moving-side conversion member 27, and the rotational movement of the shaft member 15 is transmitted to the first arm 12 via the holder-side conversion member 17, so that the first arm 12 is linearly displaced with respect to the first support 13.

Supposing that the linearly moving part 21 is swingingly displaced about the rotation axis A1 without changing the distance between the linearly moving part 21 and the rotation axis A1, the linearly moving part 21 is displaced to draw, as a trajectory, a first arc C1 about the rotation axis A1 illustrated in FIGS. 4A-4C. That is, the second arm 22 can be taken as being linearly displaced with respect to the second support 23 such that the linearly moving part 21 which is just about moving on the first arc C1 is always positioned on the second linear line L2. To put it simply, the substrate transfer device 10 is configured such that as the linearly moving part 21 is linearly moved along the second direction D2, the second arm 22 is moved to be displaced in a direction normal to the first arc C1 while swinging about the rotation axis A1.

On the other hand, if the first arm 12 cannot be linearly displaced with respect to the first support 13, the holder 11 will perform a reciprocating swing displacement about the rotation axis A1, which draws, as a trajectory, a second arc C2 illustrated in FIGS. 5A-5C. Thus, the holder 11 can be linearly displaced along the first linear line L1 by appropriately displacing the first arm 12 in the direction normal to the second arc C2 such that the platen rotation axis R1 is located on the first linear line L1.

Here, each of the amount of displacement of the first arm 12 with respect to the first support 13 and the amount of displacement of the second arm 22 with respect to the second support 23 depends on the rotational angle of the shaft member 15. Thus, the amount of displacement of the first arm 12 with respect to the first support 13 depends on the amount of displacement of the second arm 22 with respect to the second support 23. Since the second arm 22 is displaced with respect to the second support 23 of the second arm 22 such that the linearly moving part 21 is always located on the second linear line L2, the first arm 12 is also displaced such that the holder 11 is always located on the same linear line. That is, according to the configuration of the substrate transfer device 10, it is possible to reciprocatingly linearly move the holder 11 by a single driving source 30. As a result, the substrate transfer device 10 becomes free from the need for the complicated control to interlock two motors, which has heretofore been required in the related art.

Further, as mentioned above, the second arm 22 can be taken as being displaced in the direction normal to the second arc C2 such that the linearly moving part 21 is located on the second linear line L2 while being swingingly displaced about the rotation axis A1. Further, the first arm 12 can be taken as being displaced in the direction normal to the second arc C2 such that the holder 11 is linearly displaced along the first linear line L1 while being swingingly displaced about the rotation axis A1, in a manner interlocked with the movement of the linearly moving part 21. That is, the movements of the holder 11 and the first arm 12 within the processing chamber 104 whose inside is placed in a high vacuum state correspond, respectively, to the movements of the linearly moving part 21 and the second arm 22 which are placed under atmospheric pressure outside the processing chamber 104. Thus, the substrate transfer device 10 according to some embodiments is configured such that the movement of a mechanism including components disposed outside the processing chamber 104 is reproduced as the movement of a mechanism comprised of components disposed inside the processing chamber 104.

Thus, by detecting the position or movement of the linearly moving part 21 or the second arm 22 in the outside of the processing chamber 104, it becomes possible to detect the position or movement of the holder 11 or the first arm inside the processing chamber 104. For example, a sensor to detect the position of the linearly moving part 21 may be disposed, and a detection result of the sensor may be used to calculate the position of the holder 11 within the processing chamber 104.

This configuration makes it possible to calculate the position of the holder 11 within the processing chamber 104 by detecting the position of the linearly moving part 21, even in a situation where the ion beam irradiation device 100 is powered on and operated again after the ion beam irradiation device 100 is powered off, e.g., for a maintenance operation or the like.

The holder 11, the first arm 12, the linearly-moving shaft member 20, the second arm 22 and the linear movement guide 28 are configured to move in a mutually interlocked manner by a mechanical structure. Thus, by detecting the position or posture of the linearly-moving shaft member 20, the second arm 22, or the guide block 28b located outside the processing chamber 104, it is also possible to calculate what position or posture of each component of the substrate transfer device 10 takes with respect to the ion beam irradiation apparatus 100 at the time of the detection.

That is, a time required for re-operation of the ion beam irradiation apparatus 100 can be reduced. Further, by monitoring the components located outside the processing chamber 104, it becomes possible to monitor the movement of the holder 11 without disposing a sensor or the like within the high-vacuum processing chamber 104.

Further, the platen 11a is displaced about the platen rotation axis R1 to make the orientation of the to-be-processed surface Sa with respect to the ion beam IB constant. Here, with a view to making the orientation of the to-be-processed surface Sa with respect to the ion beam IB constant, an angle by which the platen 11a is displaced about the platen rotation axis R1 for a given period is coincident with a relative angle by which the linearly-moving shaft member 20 is displaced with respect to the bearing 26 during the given period.

Thus, the platen driving motor controller 29 may be configured to drive the platen driving motor 11c using a result of detection of the amount of displacement of the linearly-moving shaft member 20 with respect to the bearing 26, whereby the substrate S can be displaced in one direction while keeping the orientation of the to-be-processed surface Sa with respect to the ion beam IB constant with a high degree of accuracy. It should be noted that the platen driving motor controller 29 is not limited to the above-mentioned configuration. In some embodiments, the platen driving motor controller 29 may be configured to control the platen driving motor 11c by detecting the rotational movement of the shaft member 15.

Since the movements of the linearly moving part 21 and the holder 11 are correlated, the holder 11 can be linearly moved at a constant speed by linearly moving the linearly moving part 21 at a constant speed. The substrate transfer device 10 employs the ball screw 25, and thus it is generally easy to control the driving source 30 such that the nut 25b is linearly moved at a constant speed. Therefore, the substrate transfer device 10 can easily linearly move the holder 11 at a constant speed in a given area.

That is, in the substrate transfer device 10, it is easy to control the substrate S held by the holder 11 such that the substrate S comes across the ion beam IB in one direction at a constant speed. It should be noted that the holder 11 may be linearly displaced at a constant speed during a period in which the substrate S comes across the ion beam IB, but does not need to be always displaced between the holder-side first point P1 and the holder-side second point P2 at a constant speed.

The substrate transfer device 10 according to some embodiments is configured such that the rotation axis A1 is orthogonal to the traveling direction of the ion beam IB, and the first arm 12 is reciprocatingly swingingly displaced along a plane perpendicular to the rotation axis A1. In the substrate transfer device 10, the platen driving motor 11c is configured to drive the platen rotation axis R1 to cause the platen 11a to face the ion beam IB. Although the platen rotation axis R1 is driven by the platen driving motor 11c, the holder 11 and the first support 13 may be interlocked by a mechanical structure, thereby rotationally moving the holder 11 about the platen rotation axis R1.

The substrate transfer device 10 according to some embodiments is configured such that the ratio of the amount of displacement of the second rack 27a to the amount of displacement of the first rack 17a when the shaft member 15 is rotated by a given angle is consistent with the ratio of the distance from the linearly moving part 21 to the rotation axis A1 to the distance from the platen rotation axis R1 to the rotation axis A1. According to this configuration, the position of the linearly moving part 21 and the position of the platen rotation axis R 1 are correlated. Thus, the position of the platen 11a on the first linear line L1 can be found by, e.g., detecting the position of the linearly moving part 21 on the second linear line L2. Therefore, this configuration facilitates control of the platen driving motor 11c for rotating the platen 11a about the platen rotation axis R1. The ratio of the amount of displacement of the second rack 27a to the amount of displacement of the first rack 17a when the shaft member 15 is rotated by a given angle needs not be 1:1, but may be set arbitrarily.

The substrate transfer device 10 according to some embodiments is configured such that the linearly-moving shaft member 20, the second arm 22, the second support 23, the shaft member 15, the first arm 12, the first support 13 and the holder 11 are interlocked with each other by a mechanical structure. Thus, even when the driving source 30 is deactivated, the same operation as mentioned above is performed by applying an external force to and moving any one of the linearly-moving shaft member 20, the second arm 22, the second support 23, the shaft member 15, the first arm 12, the first support 13 and the holder 11.

Supposing that the first arm 12 is configured to be extended and retracted under driving by a motor, as in a related art technique, the first arm 12 needs to be manually extended and retracted when the operation of the ion beam irradiation device 100 is stopped, and cleaning, maintenance work, etc. are performed within the processing chamber 104. Moreover, if the first arm 12 is swung without extending and retracting the first arm 12, that the holder 11 can collide with the inner wall or a structure within the processing chamber 104. That is, when the holder 11 is retracted to perform work, a worker needs to retract the first arm 12 while swingingly displacing the first arm 12 manually.

By contrast, in the ion beam irradiation apparatus 100 using the substrate transfer device 10 according to some embodiments, the mechanical structure is configured to cause the holder 11 to be displaced along the first linear line L1 while causing the first arm 12 to be moved. Thus, the worker can displace the holder 11 along the first linear line L1 only by applying an external force to the holder 11 or the first arm 12 in one direction. That is, even when the worker performs the work within the processing chamber 104 in a state in which the operation of the ion beam irradiation apparatus 100 is stopped, good workability is provided without any risk that the holder 11 comes into contact with a structure, the chamber wall 104a or the like within the processing chamber 104.

In some embodiments, the linearly moving part 21 may be linearly displaced through the linearly-moving shaft member 20 by driving the ball screw 25. However, the configuration for linearly displacing the linearly moving part 21 is not limited thereto. For example, in some embodiments, a configuration may be employed in which the driving source 30 includes a linear motor, and the linearly moving part 21 is linearly displaced in the second direction by driving the linearly-moving shaft member 20 or the second arm 22 under driving of the linear motor. In some embodiments, the linearly moving part 21 may be configured to be driven by a timing belt, wherein the driving source 30 may drive the timing belt, thereby linearly displacing the linearly moving part 21 in the second direction D2 via the linearly moving part 21.

Next, a substrate transfer device 50 according to an embodiment will be described with reference to FIG. 6.

Figure 6:
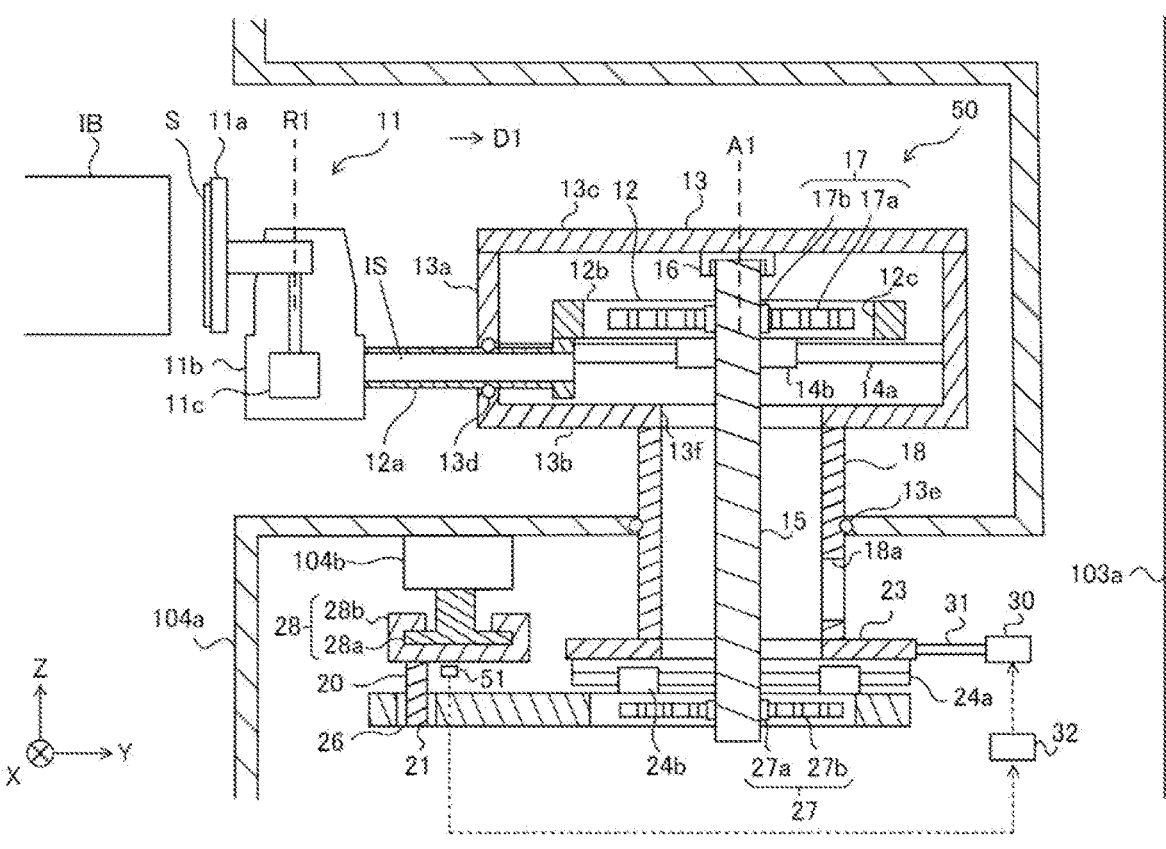
FIG. 6 is a vertical sectional view of a substrate transfer device according to an embodiment.

A difference between the substrate transfer device 10 illustrated with respect to FIGS. 1-5C and the substrate transfer device 50 illustrated with respect to FIG. 6 is how to the transmit the driving force from the driving source 30. Components of the substrate transfer device 50 common to that of the substrate transfer device 10 are assigned with the same reference sign, and repeated description thereof will be omitted for conciseness. Although not shown in FIG. 6 which is a sectional view of the substrate transfer device 50, the substrate transfer device 50 comprises an electrical cable 11d, a tube 11e, a platen driving signal line 11f, and a platen driving motor controller 29 in the same arrangement as that in the substrate transfer device 10.

As shown in FIG. 6, the substrate transfer device 50 firstly transmits a driving force from a driving source 30 to a second support 23 via a rotational movement transmitter 31. Thus, differently from the substrate transfer device 10, the substrate transfer device 50 omits the ball screw 25.

The substrate transfer device 50 also comprises a sensor 51 that measures the position of a linearly moving part 21 between a linearly moving-side first point Q1 and a linearly moving-side second point Q2. Although the sensor 51 detects the position of a guide block 28b with respect to a guide rail 28a, in some embodiments, the sensor 51 may be configured to substantially detect the position of the linearly moving part 21. A detection result of the sensor 51 is sent to a controller 32 for controlling the driving source 30, and the drive source 30 is controlled based on the detection result.

In the substrate transfer device 50, the driving force of the driving source 30 firstly rotationally moves the second support 23. Here, the linearly-moving shaft member 20, the second arm 22, the second support 23, the shaft member 15, the first arm 12, the first support 13 and the holder 11 are configured to be interlocked with each other by a mechanical structure. Thus, in the substrate transfer device 50, the linearly-moving shaft member 20, the second arm 22, the second support 23, the shaft member 15, the first arm 12, the first support 13 and the holder 11 are moved in a similar mechanism to that of the substrate transfer device 10. That is, the holder 11 is moved to be reciprocatingly linearly displaced on a first linear line L1, and the substrate transfer device 50 has similar effects as those of the substrate transfer device 10.

It is to be understood that the present disclosure is not limited to the above embodiments and the above modifications, and various modifications may be made therein without departing from the spirit and scope of the appended claims.

The invention claimed is:

1. A substrate transfer device comprising:
a shaft member disposed at a position separated from a holder that is configured to hold a substrate to be irradiated with an ion beam, the shaft member being rotationally movable in a reciprocating manner within a given rotational range about a rotation axis;

a first swing member having a linearly moving part on a distal end thereof, the linearly moving part being located at a position spaced apart from the shaft member and being linearly movable back and forth between a first point and a second point;
a first support member that supports the first swing member in a state in which the first swing member is linearly displaced within a first linear range, the first support member being rotationally movable about the rotation axis together with the first swing member;
a second swing member coupled to the holder at a distal end thereof;
a second support member supporting the second swing member in a state in which the second swing member is linearly displaced within a second linear range, the second support member being rotationally movable about the rotation axis together with the second swing member;
a first conversion member interposed between the shaft member and a proximal end of the first swing member and configured to convert a linear displacement of the first swing member with respect to the first support member to a rotational movement of the shaft member;
a second conversion member interposed between the shaft member and a proximal end of the second swing member and configured to convert the rotational movement of the shaft member to a linear displacement of the second member with respect to the second support member; and
a driving source that generates a driving force to be transmitted to the first support member to rotationally move the first support member,
wherein based on the driving force, the first support member and the second support member are rotationally moved integrally about the rotation axis, and the first swing member is linearly displaced with respect to the first support member in a manner interlocked with the linear displacement of the linearly moving part, so that the shaft member is rotationally moved via the first conversion member, and the second support member is linearly displaced with respect to the second swing member via the second conversion member.

2. The substrate transfer device as recited in claim 1, further comprising a ball screw which comprises a threaded shaft disposed along a direction connecting the first point and the second point, and a nut linearly displaceable on the threaded shaft,
wherein the driving source is configured to drive the ball screw such that the linearly moving part is linearly displaceable in a manner interlocked with the nut.

3. The substrate transfer device as recited in claim 1, wherein the rotation axis is orthogonal to a traveling direction of the ion beam, and the second swing member is configured to be swingingly displaced back and forth along a plane perpendicular to the rotation axis.

4. The substrate transfer device as recited in claim 1, wherein the first conversion member is a rack-and-pinion including a first rack disposed on the first swing member and a first pinion disposed on an outer periphery of the shaft member, and the second conversion member is a rack-and-pinion including a second rack disposed on the second swing member and a second pinion disposed on an outer periphery of the shaft member.

5. The substrate transfer device as recited in claim 1, wherein the holder comprises a platen configured to receive the substrate, and wherein the platen is configured to be rotationally moved about a platen rotation axis parallel to the rotation axis.

6. The substrate transfer device as recited in claim 5, wherein the first conversion member is a rack-and-pinion including a first rack disposed on the first swing member and a first pinion disposed on an outer periphery of the shaft member, and the second conversion member is a rack-and-pinion including a second rack disposed on the second swing member and a second pinion disposed on an outer periphery of the shaft member.

7. The substrate transfer device as recited in claim 6, wherein the shaft member is configured such that a ratio of a first displacement amount of the first rack to a second displacement amount of the second rack is the same as a ratio of a first distance from the linearly moving part to the rotation shaft to a second distance from the platen rotation axis to the rotation shaft.

8. The substrate transfer device as recited in claim 1, wherein the holder and a portion of the second swing member are exposed to an inside of a processing chamber having a vacuum state that is higher than an atmospheric pressure outside of the processing chamber, and wherein the second swing member is hollow and cylindrical and has an internal space, and an electrical cable or a tube runs from outside the substrate transfer device to the holder through the internal space.

9. The substrate transfer device as recited in claim 1, wherein the holder and a portion of the second swing member are exposed to an inside of a processing chamber, and wherein the second swing member is hollow and cylindrical and has an internal space, and an electrical cable or a tube runs from outside the substrate transfer device to the holder through the internal space.

10. The substrate transfer device as recited in claim 1, wherein the holder and a portion of the second swing member are exposed to an inside of a processing chamber having a vacuum state that is maintained during an operation of irradiating substrate with the ion beam, and wherein the second swing member is hollow and cylindrical and has an internal space, and an electrical cable or a tube runs from outside the substrate transfer device to the holder through the internal space.

* * * * *